[12] United States Patent
Manabe (10) Patent No.: US 8,742,311 B2
(45) Date of Patent: Jun. 3, 2014

(54) ENHANCED PIXEL CELL ARCHITECTURE FOR AN IMAGE SENSOR HAVING A DIRECT OUTPUT FROM A BURIED CHANNEL SOURCE FOLLOWER TRANSISTOR TO A BIT LINE

(75) Inventor: Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 313 days.

(21) Appl. No.: 13/406,383

(22) Filed: Feb. 27, 2012

(65) Prior Publication Data

US 2013/0221194 A1 Aug. 29, 2013

(51) Int. Cl.
*H01L 27/00* (2006.01)

(52) U.S. Cl.
USPC .................................... 250/208.1; 250/214 R (58) Field of Classification Search
USPC ........ 250/208.1, 214 R, 214.1; 348/207–315; 257/290–292, 440
See application file for complete search history.

(56) References Cited

U.S. PATENT DOCUMENTS 6,025,875 A * 2/2000 Vu et al. .......................... 348/241

OTHER PUBLICATIONS

Lahav, A. et al., "Optimization of Random Telegraph Noise Non Uniformity in a CMOS Pixel with a pinned-photodiode," 2007 International Image Sensor Workshop, Jun. 6-10, Ogunquit, ME, pp. 230-233, retrieved from: www.imagesensors.org.
Wang, X. et al., "A CMOS Image Sensor with a Buried-Channel Source Follower," ISSCC 2008, Session 2, Image Sensors & Technology, 2.10, 2008 IEEE International Solid-State Circuits Conference (pp. 62-63, 595).
Li, X., "Mosfet Modulated Dual Conversion Gain CMOS Image Sensors: A dissertation submitted in partial fulfillment of the requirements for the degree of Doctor of Philosophy in Electrical and Computer Engineering," Boise State University, Nov. 2008, pp. 1-173.
Martin, S. T. et al., "Modeling the Bias and Scaling Dependence of Drain Current Fluctuations Due to Single Carrier Trapping in Submicron MOSFET's," Device Research Conference, 1996, Digest, 54th Annual, pp. 116-117.
Janesick, J., "Charge coupled CMOS and hybrid detector arrays," SPIE, San Diego, Focal Plane Arrays for Space Telescope, Paper #5167-1, Aug. 2003, pp. 1-18.
Martin-Gonthier, P. et al., "Low-Frequency Noise Impact on CMOS Image Sensors," In $24^{th}$ Conference on Design Circuits, DCIS '09, 2009, pp. 1-6.
Martin-Gonthier, P. et al., "RTS Noise Impact in CMOS Image Sensors Readout Circuit," 2009 16th IEEE International Conference on Electronics, Circuits and Systems, IEEE 2009, pp. 928-931.

* cited by examiner

*Primary Examiner* — Que T Le
(74) *Attorney, Agent, or Firm* — Blakely Sokoloff Taylor & Zafman LLP (57) ABSTRACT

A backside illuminated pixel array having a buried channel source follower of a pixel cell which is coupled to output an analog signal directly to a bitline as image data. In one embodiment, the buried channel source follower of a pixel cell is coupled to a source follower power line having a line impedance which is less than that of one or more other signal lines for operating that same pixel cell. In another embodiment, a source follower power line has a line impedance which is less than at least one of a line impedance of a transfer signal line or a line impedance of a reset signal line.

20 Claims, 6 Drawing Sheets

ENHANCED PIXEL CELL ARCHITECTURE FOR AN IMAGE SENSOR HAVING A DIRECT OUTPUT FROM A BURIED CHANNEL SOURCE FOLLOWER TRANSISTOR TO A BIT LINE

BACKGROUND OF THE INVENTION

1. Field of the Invention

This disclosure relates generally to image sensors, and in particular but not exclusively, relates to backside illumination CMOS image sensors.

2. Background Art

Image sensors have become ubiquitous. They are widely used in digital still cameras, cellular phones, security cameras, as well as, medical, automobile, and other applications. The demands of higher resolution and lower power consumption have encouraged further miniaturization and integration of these image sensors. As a result, technology used to manufacture image sensors, for example, CMOS image sensors ("CIS"), has continued to advance at a great pace.

Figure 1:
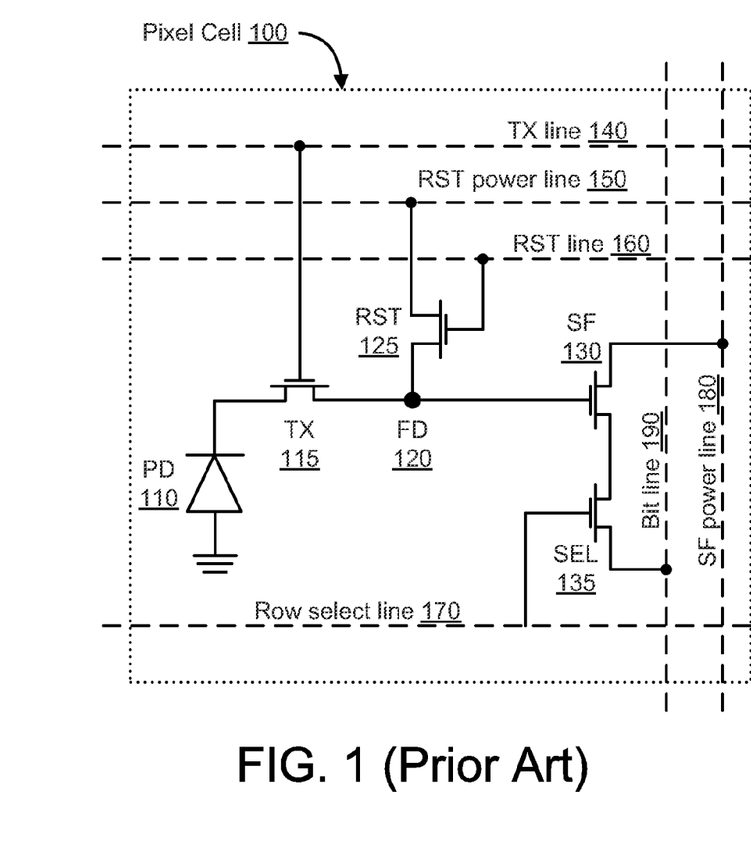
FIG. 1 is a circuit diagram showing a conventional 4T pixel cell.

FIG. 1 is a circuit diagram illustrating circuitry of four-transistor ("4T") pixel cell 100 of a conventional image sensor device. Pixel cell 100 includes photodiode PD 110, transfer transistor TX 115, reset transistor RST 125, source follower ("SF") transistor SF 130, and row select transistor SEL 135. During operation, transfer transistor TX 115 receives a transfer signal provided via TX line 140, which transfers charge accumulated in PD 110 to floating diffusion node FD 120. RST 125 is coupled between RST power line 150 and FD 120 to reset the pixel (e.g., to discharge or charge FD 120 and/or PD 110 to a preset voltage) under control of a reset signal provided via RST line 160. FD 120 is also coupled to control the gate of SF 130. SF 130 is coupled between SF power line 180 and SEL 135. SF 130 operates as a source-follower providing a high impedance connection to FD 120. Under control of a select signal which is provided via row select line 170, SEL 135 selectively provides an output of pixel 100 to column readout line or bit line 190.

PD 110 and FD 120 are reset by temporarily asserting the reset signal of RST line 160 and the transfer signal of TX line 140. An image accumulation window (exposure period) is commenced by de-asserting the transfer signal of TX line 140 and permitting incident light to charge PD 110. As photogenerated electrons accumulate on PD 110, its voltage decreases. The voltage or charge on PD 110 is indicative of the intensity of the light incident on PD 110 during the exposure period. At the end of the exposure period, the transfer signal of TX line 140 is asserted to allow an exchange of charge between PD 110 and FD 120, and hence the gate of SF 130. The charge transfer causes the voltage of FD 120 to drop by an amount which is proportional to photogenerated electrons accumulated on PD 110 during the exposure period. This second voltage biases SF 130 which, in combination with the select signal being asserted on row select line 170, drives a signal from SEL 135 to bit line 190. Data is then readout from pixel cell 100 onto bit line 190 as an analog signal.

Many current semiconductor image sensors today are frontside illumination (FSI) devices. That is, they include imaging arrays that are fabricated on the frontside of a semiconductor wafer, where light may be received at the imaging array from the same frontside. A FSI image sensor has disposed on or over the frontside of a silicon wafer a metal stack, where the metal stack includes metal layers (e.g. separated by inter-metal dielectric layers) to variously provide signal lines to respective pixel elements of a pixel array.

In existing FSI technology, the routing and utilization of traces in a metal stack is constrained by the fact that light received by a given pixel cell first has to pass through the metal stack. For example, in a pixel array having pixel cells such as pixel cell 100, a given row (not shown) of pixel cells share TX line 140 and RST line 160. However, use of any additional row-wise lines by pixel cell 100 is constrained due to a need to accommodate the receipt of light by PD 110. Accordingly, rather than also being shared across such a row, SF power line 180 is coupled to one pixel cell of the row, but not to the other pixel cells of that row. Rather, SF power line 180 only provides current to source follower transistors of pixel cells (not shown) which, as compared to such a row of pixel cells, form an orthogonal column of pixel cells. Such a column of pixel cells share bit line 190, and so cannot be read out concurrently on a column-wise basis.

Generally speaking, miniaturization in image sensors results in smaller photodiodes which generate smaller amounts of charge for smaller amounts of incident light, where signals of smaller voltage and/or current levels are in turn generated for representation of the captured image. The effective generating and processing of such signals poses one challenge for next-generation image sensors.

BRIEF DESCRIPTION OF THE DRAWINGS

The various embodiments of the present invention are illustrated by way of example, and not by way of limitation, in the figures of the accompanying drawings and in which.

DETAILED DESCRIPTION

One result of improved integrated circuit (IC) fabrication techniques for pixel arrays is a reduction in the size of transistors such as source follower transistors. However, these smaller SF transistors tend to be more susceptible to noisy signal characteristics such as random telegraph signal (RTS) noise. Such noise may degrade image quality. Buried channel transistors demonstrate good noise performance characteristics—e.g. as compared to various surface channel transistors. However, such buried channel transistors are inadequate as source follower transistors, for example, due at least to the tendency of such buried channel transistors to be susceptible to current leak.

In an embodiment, a backside illumination (BSI) image sensor includes an imaging array that is fabricated on the front surface (or frontside) of a semiconductor wafer, but is to receive light through a back surface of such a wafer. To detect light received via the backside, the silicon wafer of a BSI pixel array may be relatively thin, as compared to that of a FSI pixel array. In certain embodiments, color filters and/or microlenses may be included on the back surface of the wafer in order to improve the sensitivity of the BSI sensor. The metal stack of a BSI image sensor may not be in the path of light which is received via the backside of a silicon wafer in such a BSI image sensor.

Certain embodiments variously avail of an opportunity, presented by the location of a BSI sensor's metal stack with respect to the path of light which the BSI sensor is to receive, to implement a space-efficient pixel cell architecture which also provides structures to effectively limit signal noise. In an embodiment, a pixel array includes a plurality of pixel cells which are operable as a group to concurrently provide respective pixel cell output signals. By way of illustration and not limitation, the plurality of pixel cells may share one or more signal lines—e.g. one or more of a transfer signal line, a reset signal line and a source follower power line—for at least partial coordination of the pixel cells' respective operations. Such a plurality of pixel cells may, for example, be in line with one another in the pixel array. For the purpose of discussing certain features of various embodiments, such a plurality of pixel cells is referred to herein as a row of pixel cells. However, such a row of pixel cells may alternatively be referred to as a column of pixel cells, or other such label.

In certain embodiments, a SF power line for operating a pixel cell may be oriented in a row-wise direction—e.g. perpendicular to a bitline for reading an output analog signal from the row. A SF power line of a pixel array may extend across, and be shared by, a row of pixel cells operable as a group to concurrently provide respective pixel cell output signals. Such a shared SF power line may provide a variable SF power signal to selectively operate—e.g. as a group—the respective source follower transistors of pixel cells in the row.

A SF power line may, in an embodiment, span a row having pixel cells which include respective buried channel SF transistors. Such a row of pixel cells might otherwise be particularly susceptible to the effects of aggregate current leakage from the multiple buried channel SF transistors—e.g. but for other features which certain embodiments provide to reduce such susceptibility. For example, embodiments variously provide a pixel cell comprising a SF transistor which couples to a SF power line having a lower line impedance than the respective impedances of one or more other signal lines for operating the pixel cell. The one or more other signal lines may, for example, include either or both of a TX line coupled to the gate of a TX transistor of the pixel cell and a RST line coupled to the gate of a RST transistor of the pixel cell. In an embodiment, a SF power line may extend over or through a pixel cell along a direction which is in parallel with some or all of the one or more other signal lines. For example, a portion of the SF power line extending over or through a given pixel cell may be parallel with a corresponding portion of a TX line for the given pixel cell and/or with a corresponding portion of a RST line for the given pixel cell.

In an embodiment, the impedance of a SF power line may be low at least by comparison to one or more other signal lines for operating the pixel cell. A comparatively low SF power line impedance may, for example, be achieved at least in part by the SF power line having a large cross-sectional area—e.g. as compared to a corresponding cross-sectional area of some other signal line for operating the pixel cell. In an embodiment, traces in a metal stack for a pixel cell may be aluminum, for example, where an aluminum SF power line for the pixel cell has a width or thickness which is at least 80% of a pixel pitch for the pixel array. Alternatively or in addition, traces in a metal stack for a pixel cell may be copper, where a copper SF power line for the pixel cell has a width or a thickness which is at least 50% of the pixel pitch. A SF power line may include any of a variety of other dimensions and/or metals, according to different embodiments.

Certain embodiments avail of an opportunity, presented by the reduced effects of both source follower noise and source follower current leak, to eliminate altogether a transistor which is dedicated to row selection functionality—e.g. a transistor such as SEL 135. A selection transistor such as SEL 135 might otherwise be needed in certain pixel cell architectures—e.g. to prevent the risk of an output signal being sent from a pixel cell accidentally due to current leak by an SF transistor. Without row select transistors in a row of pixel cells, multiple leaky SF transistors of such a row may, for example, contribute to the overall pixel array exhibiting column-wise fixed pattern noise. By contrast, certain embodiments provide for a pixel cell architecture which does not need to include a row select transistor, and which is protected from aggregate source follower noise and/or source follower current leak affecting operation of a row of pixel cells.

Figure 2:
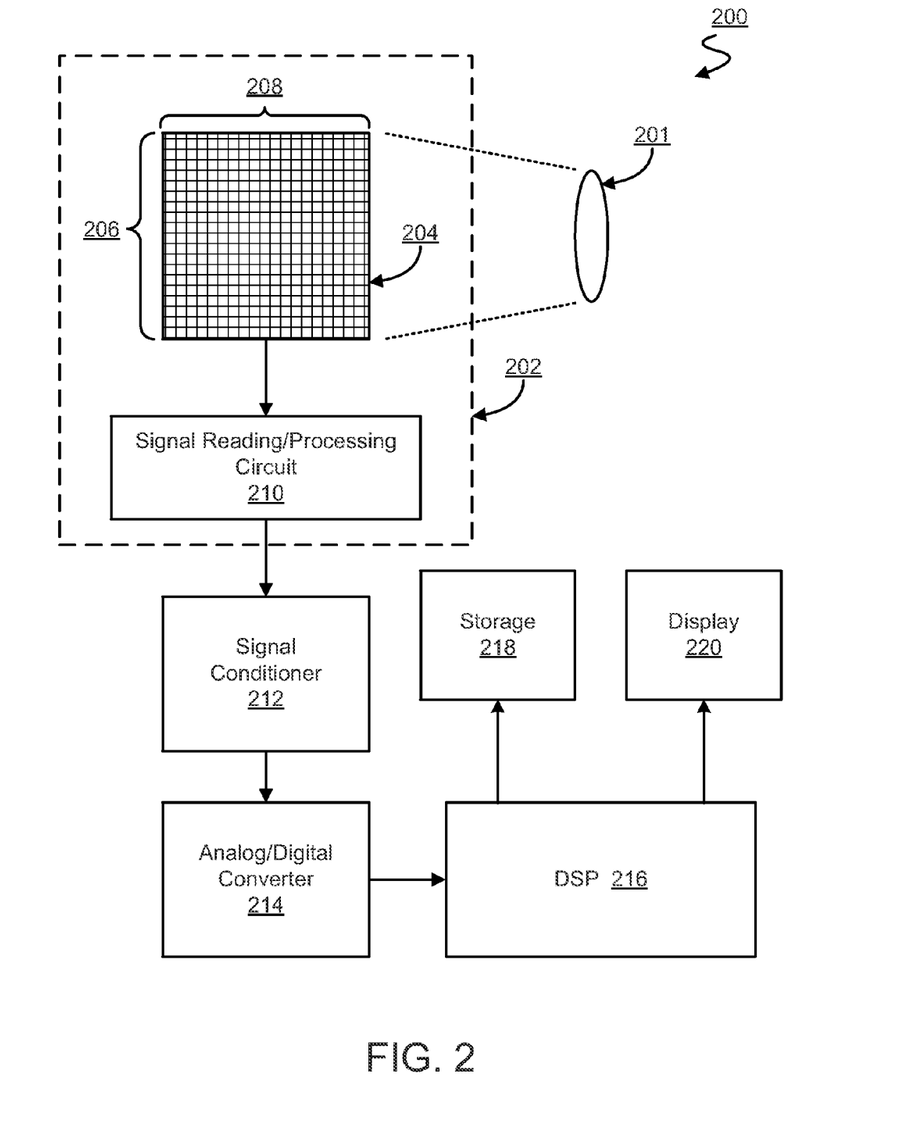
FIG. 2 is a block diagram illustrating elements of a backside illumination imaging system according to an embodiment.

FIG. 2 illustrates elements of an imaging system 200 according to an embodiment. Imaging system 200 may include optics 201, an image sensor 202 to receive light via optics 201, and circuitry to receive and process signals generated by image sensor 202 based on such received light. In imaging system 200, circuitry to receive and process signals generated by image sensor 202 is represented as including one or more of an illustrative signal conditioner 212, analog-to-digital converter (ADC) 214, digital signal processor (DSP) 216, storage 218 and display 220. However, any of a variety of combinations of one or more additional or alternative components to receive and process such signals may be provided, according to different embodiments.

Optics 201, which may include refractive, diffractive or reflective optics or combinations thereof, may be coupled to image sensor 202 to focus an image onto the pixels in pixel array 204 of the image sensor. Pixel array 204 may capture the image and the remainder of imaging system 200 may process resulting pixel data for representing the image.

Image sensor 202 may, for example, comprise a pixel array 204 and a signal reading and processing circuit 210. Pixel array 204 may include a plurality of pixels arranged in rows 206 and columns 208. During operation of pixel array 204 to capture an image, some or all of the pixels in pixel array 204 may capture incident light (i.e., photons) during a certain exposure period and convert the collected photons into an electrical charge. The respective electrical charges generated by such pixels may each be read out as a corresponding analog signal, where a characteristic of such an analog signal—e.g. its charge, voltage or current—is representative of the intensity of light that was incident on the pixel during the exposure period.

Illustrated pixel array 204 is regularly shaped, but in other embodiments the array may have a regular or irregular arrangement different than shown and may include more or less pixels, rows, and columns than shown. Alternatively or in addition, pixel array 204 may be a color image sensor—e.g. including red, green, and blue pixels designed to capture images in the visible portion of the spectrum—a black-and-white image sensor and/or an image sensor designed to capture images in the invisible portion of the spectrum, such as infra-red or ultraviolet.

Image sensor 202 may include signal reading and processing circuit 210 having logic to methodically read analog signals from some or all pixels of pixel array 204 and, in an embodiment, to further provide processing—e.g. to filter such signals, correct for defective pixels, provide white balancing and/or the like. In an embodiment, circuit 210 may perform only some signal processing—e.g. where other signal processing is performed by one or more other components such as signal conditioner 212 or DSP 216. Although shown as an element separate from pixel array 204, in some embodiments reading and processing circuit 210 may be integrated with pixel array 204—e.g. on the same silicon substrate and/or otherwise comprising circuit logic embedded within pixel array 204. In other embodiments, reading and processing circuit 210 may be an element not only external to pixel array 204, but also external to image sensor 202.

Signal conditioner 212 may be coupled to image sensor 202 to receive and condition analog signals from pixel array 204 and reading and processing circuit 210. In different embodiments, signal conditioner 212 may include various components for conditioning analog signals. Examples of components that may be found in signal conditioner 212 include filters, amplifiers, offset circuits, automatic gain control, etc. ADC 214 may be coupled to signal conditioner 212 to receive conditioned analog signals corresponding to each pixel in pixel array 204 from signal conditioner 212 and convert these analog signals into digital values.

DSP 216 may be coupled to ADC 214 to receive digitized pixel data from ADC 214 and process the digital data to produce a final digital image. DSP 216 may, for example, include a processor and an internal memory in which it may store and retrieve data. After the image is processed by DSP 216, it may be output to one or both of a storage unit 218 such as a flash memory or an optical or magnetic storage unit and a display unit 220 such as an LCD screen.

Figure 3:
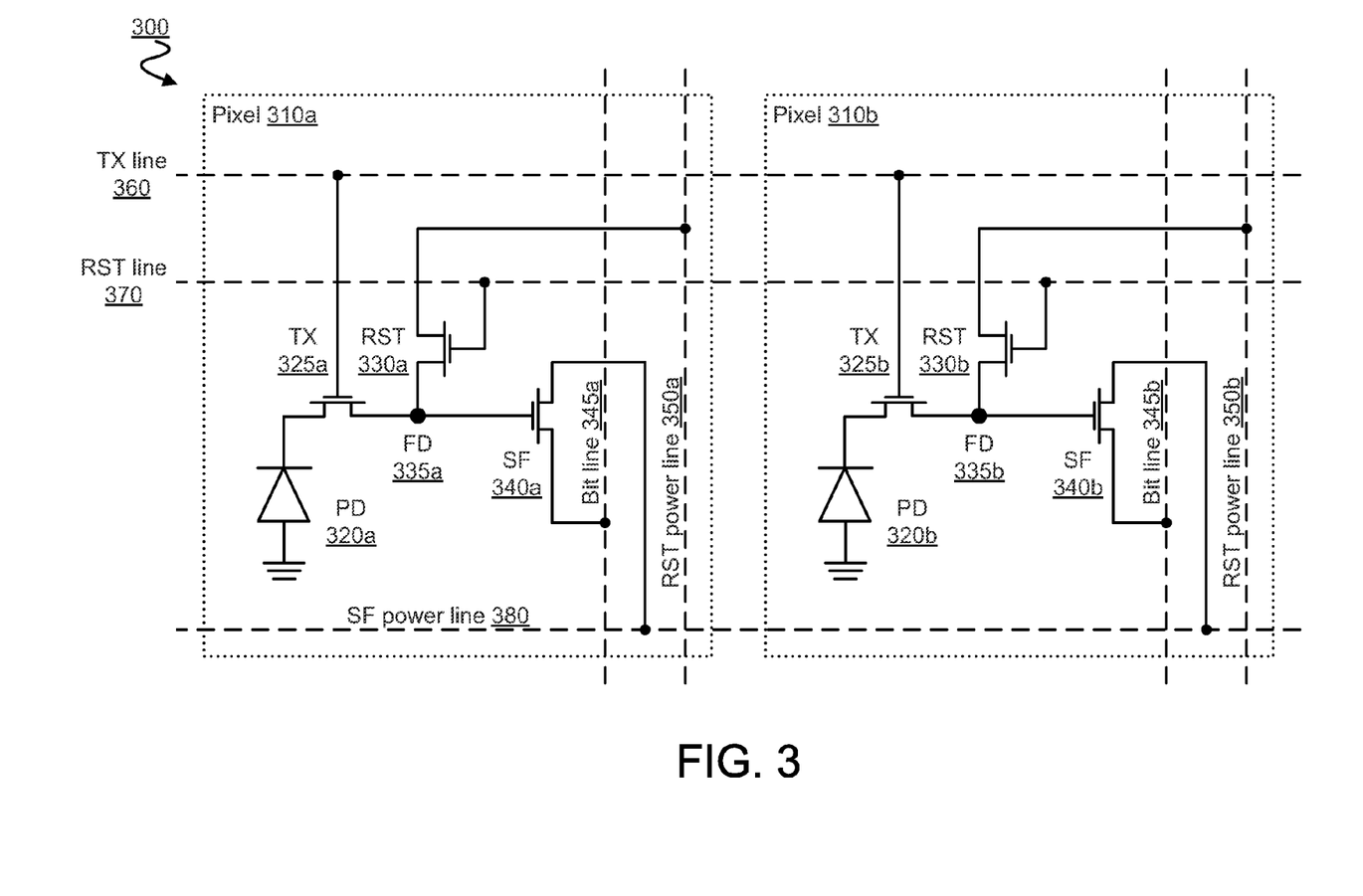
FIG. 3 is a circuit diagram illustrating elements of a pixel array according to an embodiment.

FIG. 3 is a circuit diagram illustrating elements of circuitry of a pixel array 300 according to an embodiment. Pixel array may include some or all of the features of pixel array 204, for example. In an embodiment, pixel array 300 includes multiple BSI pixel cells, represented by illustrative pixel cells 310a, 310b.

Pixel 310a may include photodiode PD 320a, transfer transistor TX 325a, reset transistor RST 330a, and source-follower transistor SF 340a. Additionally or alternatively, pixel 310b may similarly include PD 310b, transfer transistor TX 315b, reset transistor RST 325b, and source-follower transistor SF 330b. In an embodiment, TX line 360 of pixel array 300 provides signaling to operate transistors TX 325a, 325b. RST line 370 of pixel array 300 may provide signaling to operate transistors RST 330a, 330b. Additionally or alternatively, SF power line 380 may provide signaling to power transistors 340a, 340b. In an embodiment, bit lines 345a, 345b of pixel array 300 may exchange variously output signals from pixels 310a, 310b, respectively. Additionally or alternatively, RST power lines 350a, 350b may provide signaling to power transistors 340a, 340b, respectively. Various features of pixel array 300 are discussed below in terms of the operation of PD 320a, TX 325a, RST 330a, and SF 340a for pixel 310a. Such discussion may be extended to additionally or alternatively apply to corresponding operation of PD 320b, TX 325b, RST 330b, and SF 340b for pixel 310b.

During operation of pixel cell 310a, TX 325a may receive a transfer signal, provided via TX line 360, which activates TX 325a to transfer charge accumulated in PD 320a to floating diffusion node FD 335a. RST 330a may be coupled between RST power line 350a and FD 335a to reset the pixel (e.g., to discharge or charge FD 335a and/or to set PD 320a to some preset voltage) under control of a reset signal provided via a RST line 370. FD 335a may be coupled to control the gate of SF 340a. SF 340a may be coupled between SF power line 380 and bit line 345a. In an embodiment, SF 340a is coupled directly to bit line 345a. SF 340a may operate as a source-follower providing a high impedance connection to FD 335a. Under control of a voltage variously provided at different voltage levels by FD 335a, SF 340a may provide an output of pixel 300a to readout bit line 345a.

In operation, PD 320a and FD 335a may each be variously reset by asserting the transfer signal of TX line 360 and temporarily asserting the reset signal of RST line 370 and RST power line 350a. An image accumulation window (exposure period) may be commenced by de-asserting the transfer signal of TX line 360 and permitting incident light to charge PD 320a. As photo-generated electrons accumulate on PD 320a, its voltage decreases. The voltage or charge on photodiode PD 320a may be indicative of the intensity of the light incident on PD 320a during the exposure period. At the end of the exposure period, the transfer signal of TX line 360 may be asserted to allow an exchange of charge between PD 320a and FD 335a and hence the gate of SF 340a. The charge transfer may cause the voltage of FD 335a to drop by an amount which is proportional to photogenerated electrons which accumulated in PD 320a during the preceding exposure period. In an embodiment, the potential of FD 335a may be set to a lower potential than a threshold voltage of SF 340a when SF 340a inactive. The voltage drop at FD 335a may bias SF 340a, resulting in an analog signal from SF 340a to bit line 345a. The analog signal may be read out from bitline 345a as image data output from pixel cell 300a. As shown in the discussion below, pixel cells 310a, 310b may be read from by operating SF 340a and 340b, even though neither of pixel cells 310a, 310b has a dedicated row select transistor such as SEL 135.

In an embodiment, pixel cells 310a, 310b are at least part of a row of pixel cells in pixel array 300 which are operable as a group to concurrently provide respective pixel cell output signals. By way of illustration and not limitation, one or more of TX line 360, RST line 370 and SF power line 380 may variously provide signals for at least partial coordination of respective operations of such a row's pixel cells. SF power line 380 may extend across, and be shared by, such a row of pixel cells to provide a variable SF power signal for selectively operating, as a group, the respective source follower transistors of pixel cells in the row.

In an embodiment, pixels in such a row may include one or more buried channel SF transistors—e.g. where transistors SF 340a, SF 340b are each buried channel transistors. Such a row of pixel cells might otherwise be particularly susceptible to the effects of aggregate current leakage from the multiple buried channel SF transistors—e.g. but for other features which certain embodiments provide to reduce such susceptibility. For example, embodiments variously include having SF 340a of pixel cells 310a couple to a SF power line 380 having a lower line impedance than the respective line impedances of one or more other signal lines for operating pixel cell 210a. In an embodiment, SF power line 380 has a lower line impedance than does one or more of TX line 360 and RST line 370.

In an embodiment, SF power line 380 extends over or through pixel cell 310a, for example, along a direction which is in parallel with some or all of the one or more other signal lines (such as TX line 360 and/or RST line 370) which have greater line impedance. For example, a portion of the SF power line 380 extending over or through pixel cell 310a may be parallel with a corresponding portion of TX line 360 extending over pixel cell 310a and/or with a corresponding portion of RST line 370 extending over pixel cell 310a.

A comparatively low SF power line impedance may be achieved at least in part by SF power line 380 having a large cross-sectional area—e.g. as compared to a corresponding cross-sectional area of some other signal line for operating the pixel cell. Cross-section of a signal line may be measured, for example, across a direction along which the signal line extends completely over or through a particular pixel cell. In an embodiment, SF power line 380 may be aluminum and have a width or thickness which is at least 80% of a pixel pitch for pixel array 300. Alternatively, SF power line 380 may be copper and have a width or thickness which is at least 50% of a pixel pitch for pixel array 300. SF power line 380 may include any of a variety of other dimensions and/or metals, according to different embodiments.

Certain embodiments avail of an opportunity, presented by the reduced effects of both source follower noise and source follower current leak, to eliminate altogether a transistor which is dedicated to row selection functionality—e.g. a transistor such as SEL 135. A selection transistor such as SEL 135 might otherwise be needed in certain pixel cell architectures—e.g. to prevent the risk of an output signal being sent from a pixel cell accidentally due to current leak by an SF transistor. However, the pixel architecture for pixel cells 310a, 310b dispenses with a dedicated row select transistor—e.g. by directly coupling SF 340a to bitline 345a.

Figure 4:
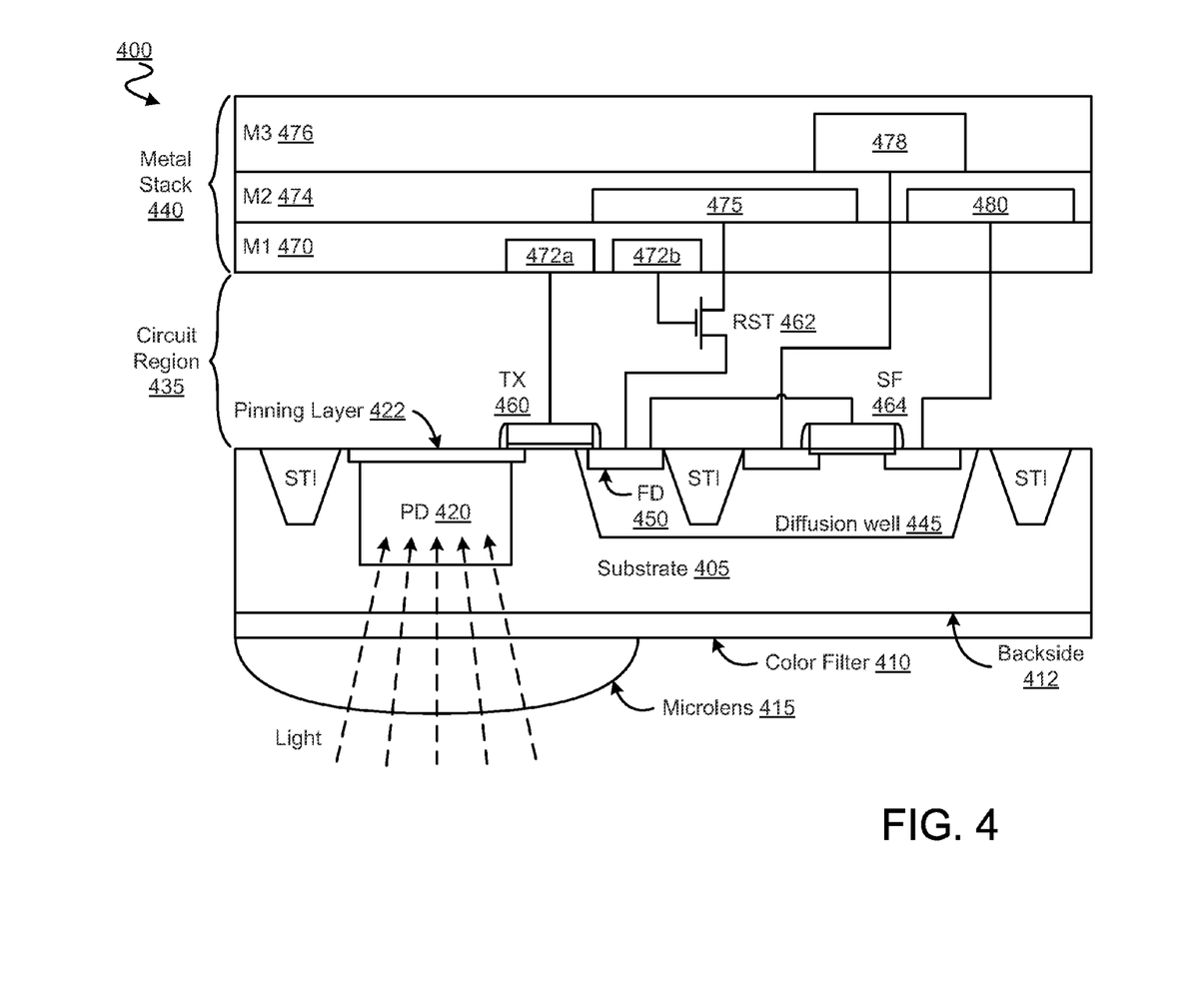
FIG. 4 is a hybrid cross-sectional/circuit diagram illustrating elements of a pixel array according to an embodiment.

FIG. 4 is a hybrid cross-sectional/circuit diagram illustrating elements of a backside illumination pixel array 400 in accordance with one embodiment. To illustrate features of various embodiments, FIG. 4 shows both an example of an arrangement of circuit element of a pixel cell and a metal stack 440 having various signal lines to provide respective signals to at least that pixel cell. Pixel array 400 is one possible implementation of pixels within pixel array 204, for example. Pixel array 400 may include some or all of the features of pixel array 300, although certain embodiments are not limited in this regard.

Pixel array 400 may include a substrate 405 of semiconductor material having formed therein a photodiode region PD 420 of the pixel cell, where PD 420 is to accumulate charge in response to light incident upon PD 420. PD 420 may receive such light via a path through a backside 412 of substrate 405—e.g. where the light also passes through a microlens 415 and/or a color filter 410 of pixel array 400. A passivation or pinning layer 422 may be disposed over PD 420 in substrate 405, although certain embodiments are not limited in this regard. Formation of one or more of PD 420, microlens 415 and color filter 410 may be according to any of a variety of known fabrication techniques.

Pixel array 400 may further include one or more other elements of the pixel cell variously formed in or on substrate 405. By way of illustration and not limitation, substrate 405 may have a floating diffusion node FD 450—e.g. disposed in a diffusion well 445 within substrate 405. In an embodiment, functionality of FD 450 in the operation of pixel array 400 corresponds to functionality of FD 335a (or of FD 335b). In an embodiment, one or more shallow trench isolations ("STI") may be formed in substrate 405 to variously isolate certain elements of pixel cell 400 from one another and/or from adjacent pixels (not illustrated).

Substrate may include a transfer transistor TX 460 disposed over a portion of substrate 405 which is between PD 420 and FD 450—e.g. wherein functionality of TX 460 in the operation of pixel array 400 corresponds to functionality of TX 325a (or of TX 325b). For example, a gate of TX 460 may be coupled to a transfer signal line for selectively transferring charge from PD 420 to FD 450. One example of such a transfer signal line is represented by an illustrative trace 472a in a metal layer M1 470 of metal stack 440.

The pixel cell shown in FIG. 4 may include one or more other pixel elements for operation with some or all of PD 420, TX 460 and FD 450. In order to avoid obscuring certain features of various elements, some elements are shown as residing in a circuit region 435 positioned between substrate 405 and metal stack 440. Forming such circuit elements in an overlapping configuration with photodiode region 420 and/or other elements disposed in substrate 405 may, for example, improve the efficient use of valuable die real estate. However, in an alternate embodiment, some or all of the circuit elements shown in circuit region 435 may be variously formed in or directly on substrate 405—e.g. where metal stack 440 is directly in contact with substrate 405 and/or with circuit elements disposes directly on substrate 405.

In an embodiment, the pixel cell includes a reset transistor RST 462 coupled between FD 450 and a reset power line. One example of such a reset power line is represented by an illustrative trace 475 in a metal layer M2 474 of metal stack 440. Functionality of RST 462 in the operation of pixel array 400 may, for example, correspond to functionality of RST 330a (or of RST 330b). For example, a gate of RST 462 may couple to a reset signal line which provides a signal for selectively resetting a voltage of FD 450. One example of such a reset signal line is represented by an illustrative trace 472b in a metal layer M1 470.

In an embodiment, the pixel cell includes a buried channel source follower transistor SF 464 coupled between a source follower power line and a bitline for receiving an output signal of the pixel cell. One example of such a source follower power line is represented by an illustrative trace 478 in a metal layer M3 476 of metal stack 440. One example of such a bitline is represented by an illustrative trace 480 in a metal layer M2 474. By way of illustration and not limitation, diffusion well 445 may have disposed therein source/drain diffusions for buried channel SF 464 which are each for a respective coupling of buried channel SF 464 with a respective one of traces 478, 480. Functionality of buried channel SF 464 in the operation of pixel array 400 may, for example, correspond to functionality of SF 340a (or of SF 340b). For example, a gate of buried channel SF 464 may couple to FD 450 for a selective analog signal output to the bit line.

For the purpose of illustrating features of certain embodiments the transfer signal line, reset signal line, reset power line, source follower power line and bitline for operation of the pixel cell shown in pixel array 400 are represented by traces 472a, 472b, 475, 478 and 480, respectively. Moreover, traces 472a, 472b and 478 are shown extending in one direction in metal stack 440—e.g. in a row-wise direction—while traces 475, 480 are shown extending in a perpendicular direction in metal stack 440. However, the various respective metal layers and the various respective directions of traces 472a, 472b, 475, 478 and 480 are merely illustrative of one embodiment. Certain embodiments are not limited regard to the particular metal layer of a given signal line, the direction in which a given signal line extends within in a particular metal layer and/or whether a given signal line shares a metal layer with some other signal line.

In an embodiment, the pixel cell shown in pixel array 400 may be operated with a source follower power line having a line impedance which is lower that the respective line impedances of one or more other signal lines for operating the pixel cell. By way of illustration and not limitation, trace 478 may have a line impedance which is less than a line impedance of trace 472a, a line impedance of trace 472b, or both. For example, the line impedance of trace 478 relative to that of trace 472a and/or that of trace 472b may be achieved at least in part by trace 478 having a larger cross-sectional area than does either of traces 472a, 472b.

In providing a lower line impedance to power buried channel SF 464, the effect of current leak by buried channel SF 464 may be limited. In limiting the effect of such current leak, noise resistant characteristics of the buried channel in SF 464 may be exploited—e.g. by allowing direct connection of SF 464 to the bitline represented by the illustrative trace 480. As a result, the pixel cell architecture of pixel array 400 eliminates the need for a row select transistor such as one having the functionality of SEL 135, while at the same time limiting the susceptibility of the smaller pixel cell to the effects of noise such as RTS noise.

In one embodiment, substrate 405 is doped with P type dopants. In this case, substrate 405 and the epitaxial layers grown thereon may be referred to as a P substrate. In a P type substrate embodiment, diffusion well 445 is a P+well implant while PD 420 and FD 450 are N type doped. FD 450 may be doped with an opposite conductivity type dopant, as compared to that of diffusion well 445, to generate a p-n junction within diffusion well 445, thereby electrically isolating floating diffusion 450. In an embodiment where substrate 405 and the epitaxial layers thereon are N type, diffusion well 445 may be N type doped, while PD 420 and FD 450 have an opposite P type conductivity.

Figure 5:
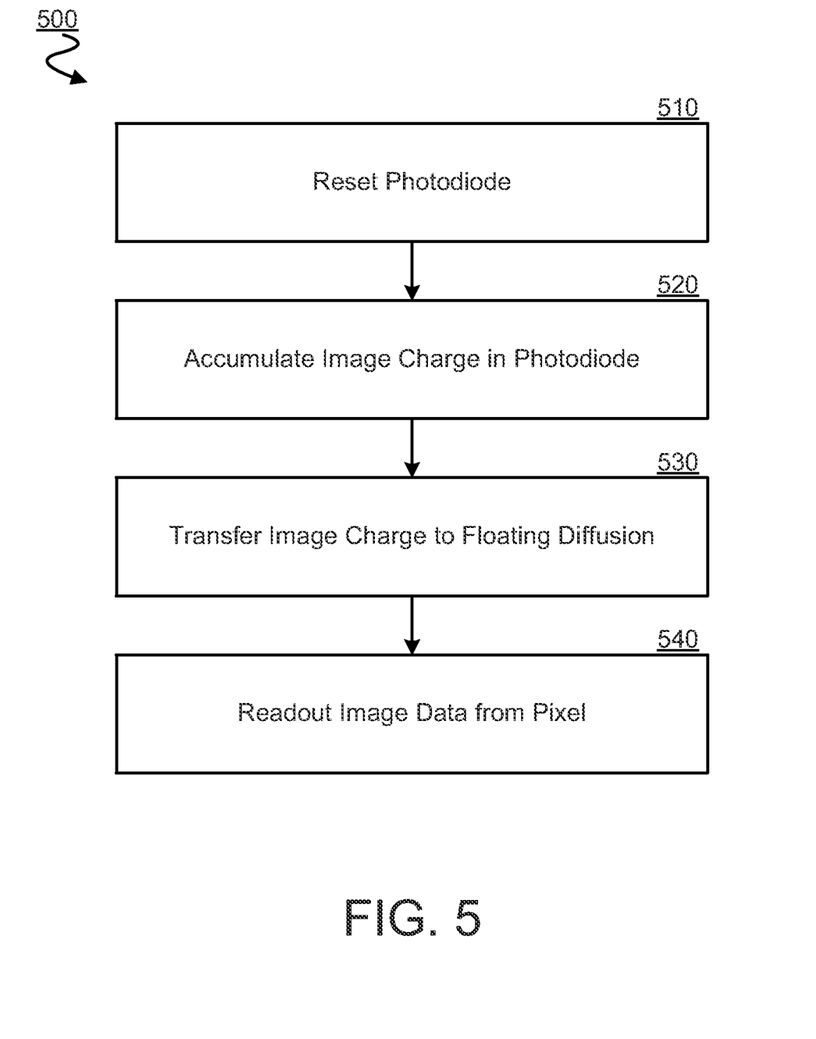
FIG. 5 is a flow diagram illustrating elements of a method for operating a pixel cell of an image sensor according to an embodiment.

FIG. 5 is a flow chart illustrating elements of a process 500 for operating a pixel cell in accordance with an embodiment. Process 500 may implement operation of a single pixel within pixel array 204, for example. In an embodiment, process 500 may be sequentially or concurrently executed with multiple respective pixels in pixel array 204—e.g. depending upon whether a rolling shutter or global shutter is used. The order in which some or all of the process blocks appear in process 500 should not be deemed limiting. Rather, one of ordinary skill in the art having the benefit of the present disclosure will understand that some of the process blocks may be executed in a variety of orders not illustrated.

In a process block 510, a photodiode (e.g., photodiode region PD 320a) may be reset. Resetting may include discharging or charging photodiode to a predetermined voltage potential. Such reset may be achieved by asserting both a reset signal and a transfer signal—e.g. a signal on RST line 370 to enable RST 330a and a signal on TX line 360 to enable TX 325a. Enabling a reset transistor and transfer transistor of the pixel cell may electrically couple the photodiode and the floating diffusion node of the pixel cell to a reset power line—e.g. a power rail VDD.

After the photodiode is reset, image acquisition by the photodiode may commence, at process block 520. For example, the reset signal and/or the transfer signal may be de-asserted to electrically isolate the photodiode for charge accumulation therein. In an embodiment, light incident on the backside of the pixel cell may be focused by a microlens and pass through a color filter layer onto the backside of the photodiode region. Such a color filter may operate to filter the incident light into component colors (e.g., using a Bayer filter mosaic or color filter array). The incident photons may cause charge to accumulate within the photodiode.

Once the image acquisition window has expired, the accumulated charge within the photodiode may, at process block 530, be transferred to the floating diffusion node—e.g. by asserting a transfer signal to the gate of the transfer transistor. In the case of a global shutter, the global shutter signal may be asserted simultaneously, as the transfer signal, to all pixels within pixel array 204 during process block 520. This may result in a global transfer of the respective image data accumulated by each pixel into the pixel's corresponding floating diffusion 450.

Once the image data is transferred, the transfer signal may be de-asserted to isolate the floating diffusion node from the photodiode, in preparation for a readout of image data from the pixel cell at process block 540. In an embodiment, the readout at block 540 may include a voltage of the floating diffusion node activating a buried channel source follower transistor (e.g. SEL 340a) coupled thereto. Such a buried channel source follower transistor may, for example, be coupled to a bitline for directly reading out the image data to the bitline as an analog signal. In various embodiments, readout may occur on a per row basis via column lines, on a per column basis via row lines, on a per pixel basis, or by other logical groupings. Once the image data of all pixels has been readout, process 500 may, in an embodiment, return to process block 510 to prepare for the next image.

In an embodiment, the buried channel source follower transistor is coupled between the bitline and a SF power line (e.g. trace 478) having a line impedance which is less than the respective line impedances of one or more other signal lines for operating the pixel cell. By way of illustration and not limitation, a line impedance of the SF power line may be lower than a line impedance of a signal line providing the transfer signal line to the pixel cell and/or a line impedance of a signal line providing the select signal to the pixel cell.

Figure 6:
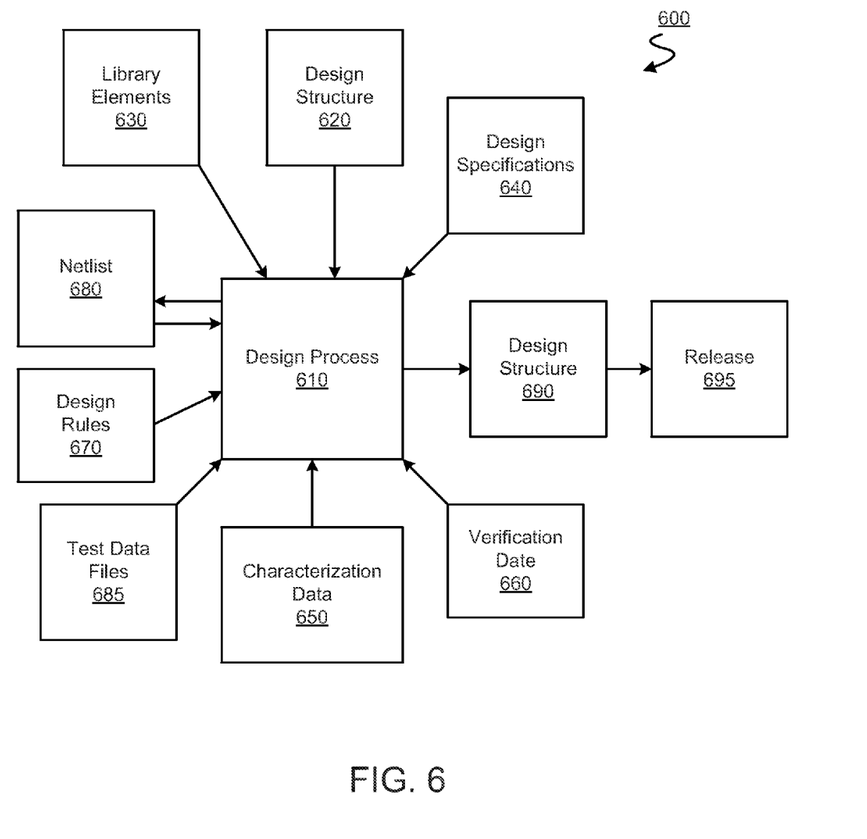
FIG. 6 is a block diagram illustrating elements of a design flow for design and manufacturing a pixel array according to an embodiment.

FIG. 6 shows a block diagram of an exemplary design flow 600 used for example, in semiconductor design and manufacturing of the image sensor pixel array and semiconductor circuits according to the present invention. Design structure 620 may include an input to a design process 610, wherein design structure 620 comprises data describing structures according to an embodiment—such as those shown in any of FIGS. 3 and 4—in the form of schematics or hardware description language (HDL; e.g., Verilog, VHDL, C, etc.). The design structure 620 may be a text file or a graphical representation of an embodiment of the invention, e.g. as shown in some or all of FIGS. 3 and 4.

A machine readable storage medium embodying a design structure may be provided. For example, the design structure may include first data representing a first pixel structure including a photodiode to accumulate charge in response to light incident upon the photodiode. The first data representing a first pixel structure may further represent a transfer transistor having a gate coupled to a transfer signal line. In operation of the first pixel structure, such a transfer signal line may provide a transfer signal for selectively transferring the charge from the photodiode to the floating diffusion node. In an embodiment, the transfer signal line has a first line impedance.

The first data representing a first pixel structure may further represent a reset transistor formed between the floating diffusion node and a reset power line, the reset transistor having a gate coupled to a reset signal line. In operation of the first pixel structure, such a reset signal line may provide a signal for selectively resetting a voltage of the floating diffusion node. In an embodiment, the reset signal line has a second line impedance.

The first data representing a first pixel structure may further represent a source follower transistor coupled to a source follower power line and directly coupled to a bit line, the source follower transistor including a gate coupled to the floating diffusion node. In operation of the first pixel structure, the coupling of the gate to the floating diffusion node may allow for a selective outputting of an analog signal to the bit line. In an embodiment, the source follower power line has a third line impedance which is less than at least one of the first line impedance of the transfer signal line or the second line impedance of the reset signal line—e.g. less than one and/or each of the first and second line impedances. A physical structure represented by each of the data of the design structure the may be the physical structures described above.

Design process 610 preferably synthesizes (or translates) an embodiment of the invention—e.g. as shown in some or all of FIGS. 3 and 4—into a netlist 680, where netlist 680 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 680 is resynthesized one or more times depending on design specifications and parameters of the circuit. The design process 610 may include using a variety of inputs; for example, inputs from library elements 630 which may house a set of commonly used elements, circuits, and devices, including models, layouts, and symbolic representations, for a given manufacturing technology (e.g., different technology nodes such as 32 nm, 45 nm, and 90 nm, etc.), design specifications 640, characterization data 650, verification data 660, design rules 670, and test data files 685 (which may include, for example, standard circuit design processes such as timing analysis, verification, design rule checking, place and route operations, etc.) One of ordinary skill in the art of integrated circuit design can appreciate the extent of possible electronic design automation tools and applications which may be used in the design process 610 without deviating from the scope and spirit of the present invention.

Design process 610 preferably translates an embodiment—e.g. as shown in some or all of FIGS. 3 and 4—along with any additional integrated circuit design or data (if applicable) into a second design structure 690. Design structure 690 resides on a storage medium in a data format used for the exchange of layout data of integrated circuits and/or symbolic data format (e.g., information stored in GDS11 (GDS2), GL1, OASIS, map files, or any other suitable format for storing such design structures). Design structure 690 may comprise information, for example, symbolic data, map files, test data files, design content files, manufacturing data, layout parameters, wires, levels of metal, vias, shapes, data for routing through the manufacturing line, and any other data required by a semiconductor manufacturer to produce one of the embodiments of the present invention as shown in FIGS. 3 and 4. Design structure 690 may then proceed to a stage 695 where, for example, design structure 690 proceeds to tapeout, is released to manufacturing, is released to a mask house, is sent to another design house, is sent back to a customer, etc.

Techniques and architectures for operating an image sensor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A backside illumination (BSI) pixel array comprising:
a transfer signal line having a first line impedance;
a reset signal line having a second line impedance;
a source follower power line having a third line impedance which is less than at least one of the first line impedance or the second line impedance; and a first pixel cell including:
- a photodiode to accumulate charge in response to light incident upon the photodiode;
- a transfer transistor having a gate coupled to the transfer signal line to selectively transfer the charge from the photodiode to a floating diffusion node;
- a reset transistor having a gate coupled to the reset signal line to selectively reset a voltage of the floating diffusion node; and
- a buried channel source follower transistor coupled between the source follower power line and a bit line, the buried channel source follower transistor including a gate coupled to the floating diffusion node to output an analog signal from the buried channel source follower transistor directly to the bit line.

2. The BSI pixel array of claim 1, wherein the third line impedance is less than both the first line impedance and the second line impedance.

3. The BSI pixel array of claim 1, wherein each of the transfer signal line, reset signal line and source follower power line includes an aluminum trace, and wherein the source follower power line has a width or a thickness which is at least 80% of a pixel pitch for the BSI pixel array.

4. The BSI pixel array of claim 1, wherein each of the transfer signal line, reset signal line and source follower power line includes a copper trace, and wherein the source follower power line has a width or a thickness which is at least 50% of a pixel pitch for the BSI pixel array.

5. The BSI pixel array of claim 1, wherein respective portions of the transfer signal line, reset signal line and source follower power line which extend over or through the first pixel are parallel to one another.

6. An image sensor system comprising:
a backside illumination (BSI) pixel array including:
- a transfer signal line having a first line impedance;
- a reset signal line having a second line impedance;
- a source follower power line having a third line impedance which is less than at least one of the first line impedance or the second line impedance;
- a first pixel cell including:
  - a photodiode to accumulate charge in response to light incident upon the photodiode;
  - a transfer transistor having a gate coupled to the transfer signal line to selectively transfer the charge from the photodiode to a floating diffusion node;
  - a reset transistor having a gate coupled to the reset signal line to selectively reset a voltage of the floating diffusion node; and
  - a buried channel source follower transistor coupled between the source follower power line and a bit line, the buried channel source follower transistor including a gate coupled to the floating diffusion node to output an analog signal from the buried channel source follower transistor directly to the bit line; and
readout circuitry coupled to read out image data from the BSI pixel array.

7. The image sensor system of claim 6, wherein the third line impedance is less than both the first line impedance and the second line impedance.

8. The image sensor system of claim 6, wherein each of the transfer signal line, reset signal line and source follower power line includes an aluminum trace, and wherein the source follower power line has a width or a thickness which is at least 80% of a pixel pitch for the BSI pixel array.

9. The image sensor system of claim 6, wherein each of the transfer signal line, reset signal line and source follower power line includes a copper trace, and wherein the source follower power line has a width or a thickness which is at least 50% of a pixel pitch for the BSI pixel array.

10. The image sensor system of claim 6, wherein respective portions of the transfer signal line, reset signal line and source follower power line which extend over or through the first pixel are parallel to one another.

11. A method at pixel cell of a backside illumination (BSI) pixel array, the method comprising:
- resetting a voltage of a floating diffusion node in response to a reset signal received at a gate of a reset transistor from a reset signal line coupled thereto, the reset signal line having a first line impedance;
- accumulating charge at a photodiode in response to light incident upon the photodiode;
- transferring charge from the photodiode via a transfer transistor to the floating diffusion node in response to a transfer signal received at a gate of the transfer transistor from a transfer signal line coupled thereto, the transfer signal line having a second line impedance, wherein a gate of a buried channel source follower transistor is coupled to the floating diffusion node, wherein the buried channel source follower transistor is further coupled between a source follower power line and a bit line, the source follower power line having a third line impedance which is less than at least one of the first line impedance or the second line impedance;
- in response to the transferring the charge to the floating diffusion node and further in response to a signal sent to the buried channel source follower transistor via the source follower power line, outputting an analog signal from the buried channel source follower transistor directly to the bit line.

12. The method of claim 11, wherein the third line impedance is less than both the first line impedance and the second line impedance.

13. The method of claim 11, wherein each of the transfer signal line, reset signal line and source follower power line includes an aluminum trace, and wherein the source follower power line has a width or a thickness which is at least 80% of a pixel pitch for the BSI pixel array.

14. The method of claim 11, wherein each of the transfer signal line, reset signal line and source follower power line includes a copper trace, and wherein the source follower power line has a width or a thickness which is at least 50% of a pixel pitch for the BSI pixel array.

15. The method of claim 11, wherein respective portions of the transfer signal line, reset signal line and source follower power line which extend over or through the first pixel are parallel to one another.

16. A tangible non-transitory computer-readable storage medium embodying a design structure, the design structure comprising:
first data representing a backside illumination (BSI) pixel array comprising:
- a transfer signal line having a first line impedance;
- a reset signal line having a second line impedance;
- a source follower power line having a third line impedance which is less than at least one of the first line impedance or the second line impedance; and
- a first pixel cell including:
  - a photodiode to accumulate charge in response to light incident upon the photodiode;
  - a transfer transistor having a gate coupled to the transfer signal line to selectively transfer the charge from the photodiode to a floating diffusion node;

a reset transistor having a gate coupled to the reset signal line to selectively reset a voltage of the floating diffusion node; and a buried channel source follower transistor coupled between the source follower power line and a bit line, the buried channel source follower transistor including a gate coupled to the floating diffusion node to output an analog signal from the buried channel source follower transistor directly to the bit line.

17. The computer-readable storage medium of claim 16, wherein the third line impedance is less than both the first line impedance and the second line impedance.

18. The computer-readable storage medium of claim 16, wherein each of the transfer signal line, reset signal line and source follower power line includes an aluminum trace, and wherein the source follower power line has a width or a thickness which is at least 80% of a pixel pitch for the BSI pixel array.

19. The computer-readable storage medium of claim 16, wherein each of the transfer signal line, reset signal line and source follower power line includes a copper trace, and wherein the source follower power line has a width or a thickness which is at least 50% of a pixel pitch for the BSI pixel array.

20. The computer-readable storage medium of claim 16, wherein respective portions of the transfer signal line, reset signal line and source follower power line which extend over or through the first pixel are parallel to one another.

* * * * *